United States Patent [19]

Baumwolspiner

[11] 3,714,402

[45] Jan. 30, 1973

[54] DIGITAL FILTER EMPLOYING SERIAL ARITHMETIC

[75] Inventor: Milton Baumwolspiner, Brooklyn, N.Y.

[73] Assignee: Bell Telephone Laboratories, Inc., Murray Hill, N.J.

[22] Filed: Dec. 20, 1971

[21] Appl. No.: 209,984

[52] U.S. Cl. ..................235/152, 235/156, 235/197, 333/18

[51] Int. Cl. .........G06f 7/38, G06f 1/02, G06f 15/34

[58] Field of Search.............235/152, 156, 164, 197; 325/42; 333/18

[56] References Cited

UNITED STATES PATENTS

| | | | |
|---|---|---|---|
| 3,665,171 | 5/1972 | Morrow | 235/152 |
| 3,521,042 | 7/1970 | Van Blerkom et al. | 235/156 |
| 3,619,586 | 11/1971 | Hoff et al | 235/152 X |
| 3,543,012 | 11/1970 | Courtney | 235/197 |

*Primary Examiner*—Eugene G. Botz
*Assistant Examiner*—James F. Gottman
*Attorney*—R. J. Guenther et al.

[57] ABSTRACT

Second-order digital filtering apparatus requiring a relatively small number of components and therefore suitable for fabrication as a small number of integrated circuits. The filter is simplified by a novel organization and by the use of serial arithmetic throughout.

12 Claims, 5 Drawing Figures

DIGITAL FILTER EMPLOYING SERIAL ARITHMETIC

BACKGROUND OF THE INVENTION

1. Field of the Invention

This invention relates to signal filtering apparatus and, more particularly, to the discrete-time signal filters known as digital filters.

2. Description of the Prior Art

With the growing interest in transmitting and processing information in digital form, a need for inexpensive digital filtering apparatus has developed. Integrated circuit technology offers the possibility of fabricating fairly complex circuits at greatly reduced cost. It has been found, however, that as the complexity of a circuit increases, the "yield" of the integrated circuit process for fabricating it decreases, thereby increasing the cost of the usable circuits. This suggests that there is an optimum circuit size suitable for economical integrated circuit fabrication.

The basic unit of most practical digital filters is the second-order filter section. Digital filters of any order or complexity can be realized by cascading or serially connecting an appropriate number of second-order filter sections. This is discussed, for example, in "An Approach to the Implementation of Digital Filters" by L. B. Jackson et al. (*IEEE Transactions on Audio and Electroacoustics*, Vol. AU-16, No. 3 (September, 1968), pp. 413–421). Thus FIG. 2 in the above article shows the cascade connection of an arbitrary number of general second-order filter sections to realize a filter transfer function of arbitrary order.

Although the digital filter organization discussed in the above article by Jackson et al. is said to be suitable for large scale integration (LSI), integration on the required scale is as yet less economical than integration on a somewhat smaller scale. In addition, the implementation suggested by Jackson et al. is suitable for very rapid processing of large amounts of data (i.e., high data rates) whereas many digital filtering applications do not require filters with such prodigious capabilities.

Another filter organization is disclosed in the copending application of P. A. Schuster, Ser. No. 99,747, filed Dec. 21, 1970. The filter organization disclosed by Schuster has a single time-shared arithmetic unit which is used to perform all the required arithmetic operations.

It is an object of this invention to simplify the organization of second-order digital filters.

It is another object of this invention to reduce the number of components required in a second-order digital filter.

It is a more particular object of this invention to provide a second-order digital filter suitable for economical integrated circuit fabrication.

It is another more particular object of this invention to provide a second-order digital filter suitable for fabrication as a relatively small number of integrated circuits.

SUMMARY OF THE INVENTION

These and other objects of this invention are accomplished, in accordance with the principles of this invention, by reorganizing the second-order digital filter and simplifying the arithmetic operations performed therein. More particularly, several of the arithmetic operations required in a second-order digital filter are performed in one or two time-shared arithmetic units which are capable of both multiplication and addition, thereby reducing the number of separate arithmetic units in the second-order section. In addition, serial arithmetic is used for all arithmetic operations with a consequent simplification of the arithmetic units. Finally, one's-complement addition may be employed instead of the traditional two's-complement addition to further simplify the arithmetic units.

Further features and objects of this invention, its nature, and various advantages, will be more apparent upon consideration of the attached drawing and the following detailed description.

DETAILED DESCRIPTION OF THE INVENTION

Figures 1, 2:
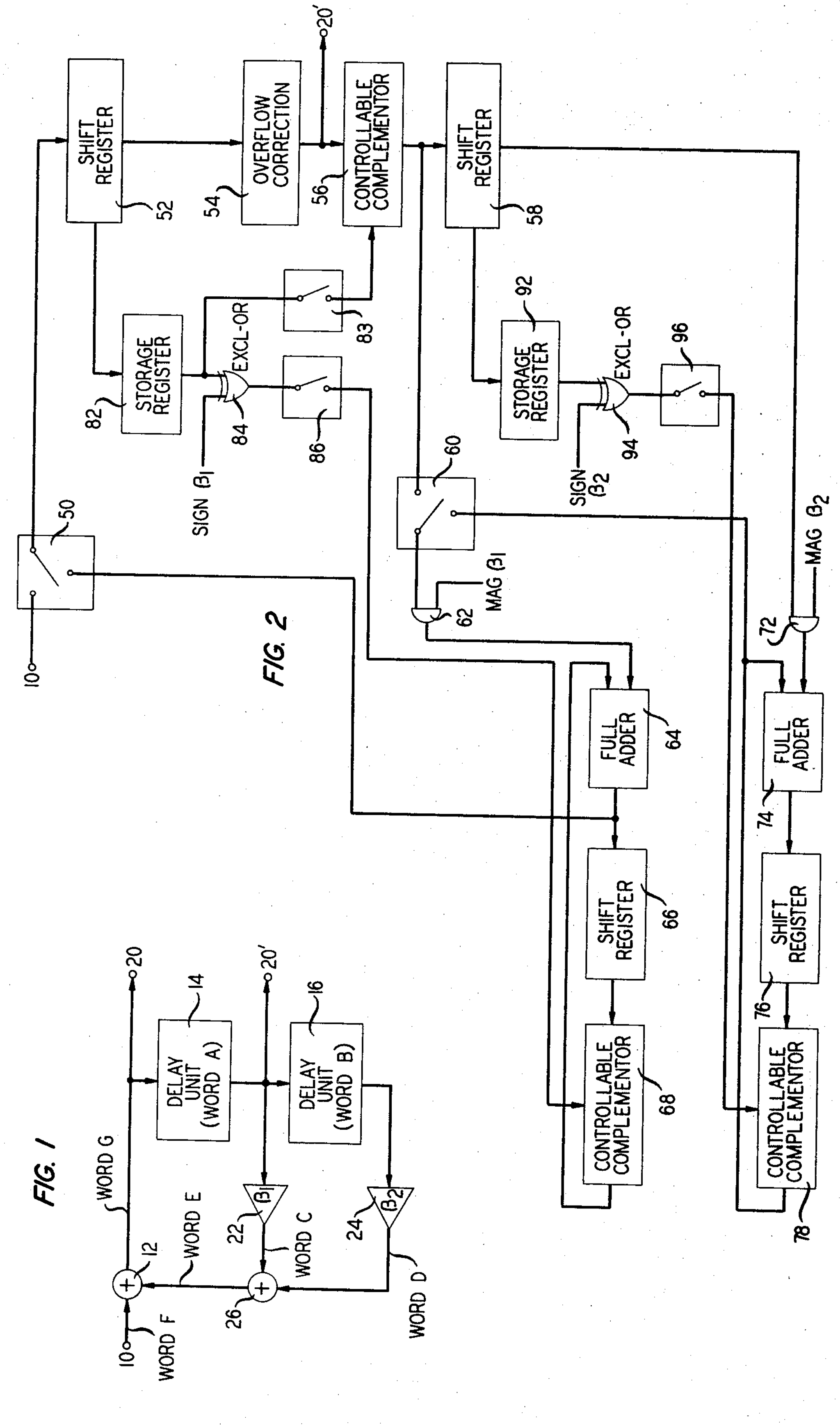
FIG. 1 is a simplified block diagram of the recursive portion of a second-order digital filter useful in explaining the operation of such filters generally.
FIG. 2 is a block diagram of a digital filter constructed in accordance with the principles of this invention for performing the filtering operation performed by the filter of FIG. 1.

Although the principles of this invention are applicable to second-order digital filters generally, the discussion is best begun by considering only the feedback or recursive portion of such a filter as shown in FIG. 1. During each cycle of the operation of the filter of FIG. 1, a digitally coded data word (designated word F in FIG. 1) is applied to the filter by way of input terminal 10 for algebraic combination with weighted versions of the data words computed by the filter in each of the two preceding filter cycles. The resulting data word (word G) is applied to output terminal 20 as the output word of the filter for the given cycle and is also stored in the first of serially connected delay units 14 and 16 for use in each of the next two filter cycles. The two previously computed data words referred to above (words A and B in FIG. 1) are stored in delay units 14 and 16. As word F is applied to the filter, each of these words is reproduced by the corresponding delay unit and multiplied by filter coefficients $\beta_1$ and $\beta_2$ in multipliers 22 and 24, respectively. The resulting product words (words C and D) are added in adder 26 to produce word E. Word E is added to input word F in adder 12 to produce output word G. As is well known to those skilled in the art, successive output words represent a filtered version of the information represented by successive input words. The filter characteristic realized depends on the values of filter coefficients $\beta_1$ and $\beta_2$.

One thing to be noted about the filter of FIG. 1 is that the output words applied to terminal 20 are also available, delayed by one filter cycle, at terminal 20'. The characteristics of the filter of FIG. 1 are not altered by using terminal 20' rather than terminal 20 as the output terminal. The only effect is to delay the output of the filter by one filter cycle.

It will be evident that the diagram of FIG. 1 represents a highly simplified version of a second-order recursive digital filter. Typically it is convenient to perform additions using binary two's-complement arithmetic. Thus words C, D, E, G, and G as applied to or generated by adders 12 and 26 are conveniently in two's-complement form. Multiplication, on the other hand, is more conveniently performed on data in sign-magnitude form to produce product words in sign-magnitude form. Accordingly, apparatus must be provided to convert words A and B from two's-complement to sign-magnitude form for processing by multipliers 22 and 24 and to convert sign-magnitude product words C and D back to two's-complement form for application to adder 26. Since positive numbers are represented identically in sign-magnitude and two's-complement form, no conversion of positive words A, B, C, or D is required. The binary digits representing the magnitude of A negative word, however, must be modified in order to convert from two's-complement to sign-magnitude or vice versa. Either conversion is effected by inverting each magnitude bit and adding 1 to the least significant place of the inverted magnitude word. The sign bit is unchanged.

The diagram of FIG. 1 is also simplified in that it does not include apparatus for detecting arithmetic overflow in the filter or for stabilizing the filter in the event that arithmetic overflow occurs. Such apparatus is shown, for example, in U.S. Pat. No. 3,609,568 issued to L. B. Jackson on Sept. 28, 1971.

Although a digital filter of the type shown in FIG. 1 can be arranged to process the several binary digits of data words in parallel, it is far more common to process the digits serially. The multipliers, however, are commonly of the serial-parallel type; that is, the relevant filter coefficient word is applied to the multiplier in parallel and each digit of the serially applied data word is used to gate (i.e., multiply) the entire coefficient word to produce a parallel partial product word. The successive partial product words are accumulated (i.e., added) in parallel to produce a final product word which is available serially. Because the coefficient word is thus treated in parallel, a multiplier of this type requires a relatively large number of gates and other devices.

In view of the extent to which the usual second-order recursive digital filter is simplified in FIG. 1, it will be understood that although FIG. 2, which illustrates a comparable filter constructed according to the principles of the invention, appears relatively more complex, the actual filter is very much simpler than the typical filter. In particular, significantly fewer devices are required to realize the filter of FIG. 2 than are required to realize the typical filter idealized in FIG. 1

Turning now to the filter of FIG. 2, shift registers 52 and 58 correspond to delay units 14 and 16 in the filter of FIG. 1. Accordingly, at the start of a filter cycle, register 52 contains a data word corresponding to word A and register 58 contains a data word corresponding to word B. Each of these words is stored in its respective register with its most significant place (i.e., the sign bit) at the top of the register as viewed and with its least significant place at the bottom of the register. Each sign bit is saved for future reference in one of storage registers 82 and 92. Shift registers 52 and 58 are then shifted one bit at a time in the direction of their respective output terminals so that the data words stored therein are serially applied to the devices connected to those terminals. At the same time, an input word corresponding to word F in the filter of FIG. 1 is applied (least significant bit first) to input terminal 10 and conveyed by way of switch 50 to the input terminal of shift register 52. Thus as the word corresponding to word A is shifted out of register 52, the word corresponding to word F is shifted into that register.

The word being shifted out of register 52 is applied to overflow correction circuit 54. Unless an arithmetic overflow condition existed in the filter during the previous filter cycle, this word is applied unaltered to controllable complementor 56. Complementor 56 is a logical device of any well-known type which converts the two's-complement word produced by shift register 52 to a sign-magnitude word for multiplication, first by filter coefficient $\beta_1$ and then, after a further delay introduced by shift register 58, by filter coefficient $\beta_2$. Accordingly, complementor 56 passes data bits applied to it unaltered unless the sign bit stored in register 82 indicates the applied quantity to be negative. In that case complementor 56 inverts each of the applied magnitude bits and adds 1 to the least significant place of inverted data words. Alternatively, complementor 56 can be a one's-complementor (i.e., a simple inverter, omitting the addition of 1 to the least significant place of inverted data words). In that event other measures, discussed below, may be taken to effectively perform the omitted addition of 1.

Each data bit generated by complementor 56 is applied to the input terminal of shift register 58 and, by way of switch 60, to one input terminal of logical AND gate 62. During this portion of the filter cycle, switch 60 is positioned to connect complementor 56 and AND gate 62. For each magnitude bit thus applied to AND gate 62, the several bits representing the entire magnitude of filter coefficient $\beta_1$ are serially applied to the remaining input terminal of AND gate 62 to produce a serial partial product word applied to one input terminal of full adder 64. Other provisions, discussed in detail below, are made for dealing with sign bits of words to be multiplied in order to determine the sign of the product. At the same time, shift register 66, which contains any previous partial product or sum of partial products, shifts to the left as viewed at the same rate that the bits of filter coefficient $\beta_1$ are applied to AND gate 62. Switch 86 is open so that controllable complementor 68 (which is similar to controllable complementor 56) passes the data applied to it unaltered. Accordingly, the data word in shift register 66 is serially applied to adder 64 for addition to the serial partial product being generated by AND gate 62 to produce a new sum of partial products stored in register 66. Shift register 66 therefore shifts out its entire contents and shifts in a new sum of partial products for each magnitude bit generated by complementor 56. The timing of the application of each new partial product and the sum of previous partial products to adder 64 must, of course, be adjusted so that each new partial product is added into the sum with the appropriate arithmetic significance. This can be accomplished by delaying the application of the sum of previous partial products by one binary place relative to the new partial product, e.g., by making shift register 66 one bit longer than the partial product words.

It will be evident from the foregoing that devices 62, 64, and 66 constitute an extremely simple serial multiplier in which AND gate 62 performs the actual multiplication while full adder 64 and shift register 66 operate as a serial accumulator to accumulate partial products until a final product (or more accurately, the magnitude of the final product) is reached. This final product is, of course, stored in register 66. During such a multiplication, complementor 68 is idling (i.e., passing data applied to it unaltered).

Devices 72, 74, and 76 operate in a manner entirely analogous to that described above to multiply the data word in shift register 58 by filter coefficient $\beta_2$. Since the data word in register 58 is already in sign-magnitude form as the result of processing by complementor 56 during the preceding filter cycle, no further pre-multiplication processing of this data word is required. Both multiplications take place simultaneously. The two product words (analogous to words C and D in the filter of FIG. 1) therefore appear in registers 66 and 76 at the same time.

During the next portion of the filter cycle, these two product words are added to produce a word comparable to word E in the filter of FIG. 1. This addition is performed by adder 64 with the resulting sum being stored in shift register 66. Switches 86 and 96 are closed, switch 60 is positioned to connect complementor 78 to one input terminal of AND gate 62, and a gate enabling signal is applied to the other input terminal of AND gate 62 (i.e., to the input lead labeled $\beta_1$). Both of shift registers 66 and 76 are then shifted to the left as viewed resulting in the serial application of the product words stored therein to the input terminals of adder 64 and the storage of the resulting serial sum word in register 66.

By virtue of the application of the sign bits of the words multiplied to form the product word in register 66 to the input terminals of exclusive OR gate 84 (i.e., the sign of word A and the sign of coefficient $\beta_1$), exclusive OR gate 84 produces an output signal indicative of the intended sign of the product word stored in register 66 (i.e., an output signal of one level when the signs of words A and $\beta_1$ are the same, implying a positive product, and of a second level when the signs of words A and $\beta_1$ are opposite, implying a negative product). Similarly, exclusive OR gate 94 produces an output signal indicative of the intended sign of the product word stored in register 76. Accordingly, complementors 68 and 78 (similar to complementor 56) operate to convert the sign-magnitude product words in registers 66 and 76 to two's-complement form for application to adder 64. Thus the addition of product words C and D is a two's-complement addition producing a two's-complement sum word stored in register 66.

If a one's-complementor is used for complementor 56, one's-complementors can also be used for complementors 68 and 78. The result of the addition of product words C and D is then restored to true two's-complement form by adding the overflow bit (i.e., the bit carried from the addition of the most significant data bits) to the least significant place of the sum word. Because of the organization of the arithmetic units of the filter, this can be accomplished simply by shifting the sum word stored in register 66 through complementor 68 (which again idles) for application to adder 64. Adder 64 thus adds the carried overflow bit to the least significant place of the sum word. This has the effect of compensating for the use of one's-complementors rather than two's-complementors.

During the next portion of the filter cycle, input word F (now stored in shift register 52) is added to the word in shift register 66 to produce a word comparable to output word G in the filter of FIG. 1. This addition takes place in adder 64 with the result being stored in shift register 52. Since both of the words to be added are in two's-complement form, no complementation is required. Accordingly, switches 83 and 86 are opened. Switch 60 is positioned to connect complementor 56 to one input terminal of AND gate 62 and a gate enabling signal is again applied to the other input terminal of AND gate 62. Switch 50 is positioned to connect the output terminal of adder 64 to the input terminal of shift register 52. Shift registers 52 and 66 are then shifted toward their respective output terminals, thereby causing the serial application of the words stored therein to the input terminals of adder 64. The resulting sum word is shifted into register 52 as word F is shifted out of that register. This sum word is available as an output word at terminal 20' during the next filter cycle.

The current filter cycle being thus completed, the filter is ready to accept and process the next input word F. An on-going filtering process is achieved by repeating the above operations.

Timing is important to the efficient operation of filters like the filter of FIG. 2. Essentially two data rates, a fast rate and a slow rate, are employed. The fast rate is on the order of $n$ times the slow rate, where $n$ is the number of bits used to represent a given data word (e.g., word F). During the first part of a given filter cycle (i.e., while words A and B are being multiplied to form words C and D and input word F is being applied to the filter for storage in register 52), shift registers 52 and 58 shift at the slow data rate. Word A is therefore shifted out of register 52 and word F is shifted into that register at the slow data rate. Similarly, word B is shifted out of register 58 and word A is shifted into that register at the slow data rate. Since word A (word G from the preceding filter cycle) is applied to output terminal 20' as it passes from register 52 to register 58, input word F is accepted by the filter at the same time and at the same data rate as output word A is produced by the filter. Moreover, since word A is tapped to output terminal 20' before processing by complementor 56, output word A, like input word F, is in binary two's-complement form. It will therefore be apparent that the output data of the filter of FIG. 2 is entirely compatible with the input data. By connecting output terminal 20' of one second-order filter to input terminal 10 of another second-order filter, any number of second-order filters can be cascaded in the well-known manner to produce a recursive digital filter of any complexity.

During this same input-output portion of the filter cycle, filter coefficients $\beta_1$ and $\beta_2$ are repeatedly applied to AND gates 62 and 72 at the fast data rate so that the entire magnitude of each coefficient word is applied to one input terminal of the appropriate AND gate for each binary digit of word A or word B applied to the other input terminal. Similarly, shift registers 66 and 76 shift at the high data rate so that their respective contents are completely displaced for each shift of registers 52 and 58.

During the next portion of the filter cycle (i.e., during the addition of words C and D to produce word E), shift registers 52 and 58 do not shift at all. Shift registers 66 and 76, on the other hand, again shift at the high data rate. Since one complete displacement of the contents of registers 66 and 76 is required to add the contents of the registers, addition requires relatively little time compared to multiplication (i.e., approximately the same time required to form a single partial multiplication product).

Finally, during the last portion of the filter cycle (i.e., during the addition of words E and F to produce word G), shift registers 58 and 76 do not shift and shift registers 52 and 66 shift at the high data rate. Again, this addition operation is relatively fast, requiring only one high speed displacement of the contents of registers 52 and 66.

In view of the fact that the required additions (i.e., the addition of words C and D to form word E and the addition of words E and F to form word G) are performed by adder 64, the filter of FIG. 2 actually includes only two arithmetic units. One arithmetic unit is time-shared between serial addition and serial multiplication. The other is needed only for serial multiplication.

Overflow correction circuit 54, mentioned briefly above, may be any conventional digital filter overflow correction circuit controlled by conventional overflow detection circuitry. Suitable apparatus is shown, for example, in U.S. Pat. No. 3,609,568 cited above. When a net positive or negative arithmetic overflow is detected from a logical inconsistency in the signs of the data being processed in a given filter cycle, the filter is stabilized by the operation of overflow correction circuit 54 during the next filter cycle. Typically, overflow circuit 54 clamps the output of shift register 52 to a positive full scale value in response to a net positive overflow or to a negative full scale value in response to a net negative overflow. Since the filter is tapped to output terminal 20' at a point beyond overflow circuit 54, the output of the filter is also stabilized by overflow circuit 54. The sign bit data needed for overflow detection is available by tapping the circuit at points analogous to those discussed in the above-cited patent.

Because of the considerable reduction in the number of components required to realize the filter of FIG. 2, the entire filter can be readily fabricated, as one or two integrated circuits. In the event that two circuits are to be fabricated, it is convenient to subdivide the circuit so that each portion essentially includes one delay unit and one arithmetic unit. In this way, minimum interconnection between the two circuits is required.

Figure 3:
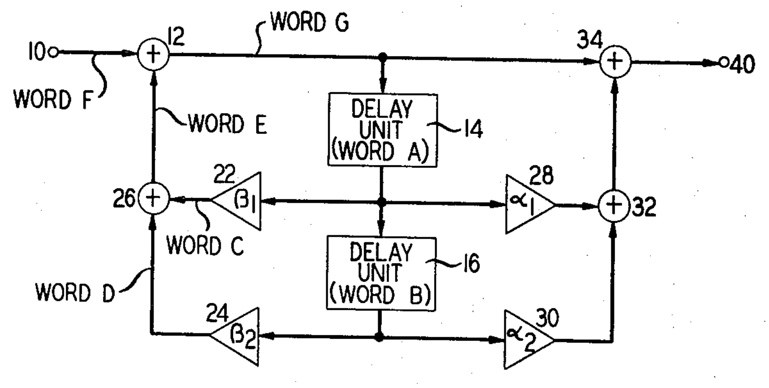
FIG. 3 is a block diagram of a general second-order digital filter.

The principles of this invention are readily extended to second-order digital filters having feed-forward as well as feedback loops, i.e., to general second-order digital filters. The general second-order filter is usually realized as shown in FIG. 3. It will be evident from FIG. 3 that the general second-order filter has all the components of the recursive second-order filter shown in FIG. 1, but that it has in addition two feed-forward loops for multiplying data words A and B by filter coefficients $\alpha_1$ and $\alpha_2$, respectively, and for adding the resulting products to word G to produce a general second-order output word applied to output terminal 40.

Figure 4:
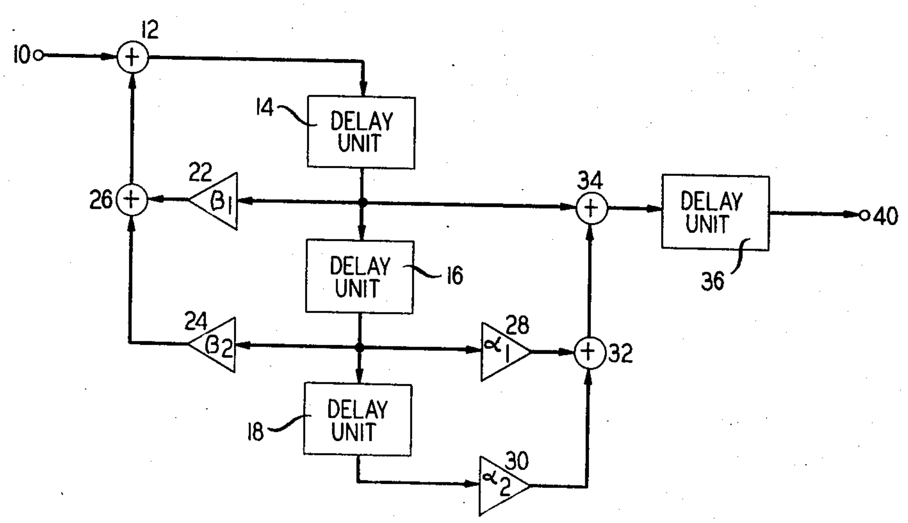
FIG. 4 is a block diagram of a modified general second-order digital filter.

Because, in the filter of FIG. 2, word G is not available (except as the output of adder 64) until the start of the filter cycle after the cycle in which it is computed, a general second-order filter like the one in FIG. 4 is more easily realized than the one in FIG. 3. It will be readily apparent that the filters in FIGS. 3 and 4 are essentially the same; the only difference being that the output of the filter of FIG. 4 is delayed two filter cycles relative to that of the filter of FIG. 3. Part of this delay results from delaying the data applied to the feed-forward portion of the filter by one filter cycle. Thus the entire feed-forward portion of the filter of FIG. 4 is shifted down relative to the feed-forward portion of the filter of FIG. 3 and a new delay unit 18 is added to the chain serially connected delay units. The remainder of the added delay is introduced by delay unit 36 which, as will be discussed in greater detail below, serves to capture the data word produced by adder 34 at the end of each filter cycle so that it can be made available at output terminal 40 during the same portion of the next filter cycle that an input word is applied to terminal 10. Delay unit 36 therefore renders the output of the filter compatible with the input, facilitating the cascade or serial connection of such filters.

Figure 5:
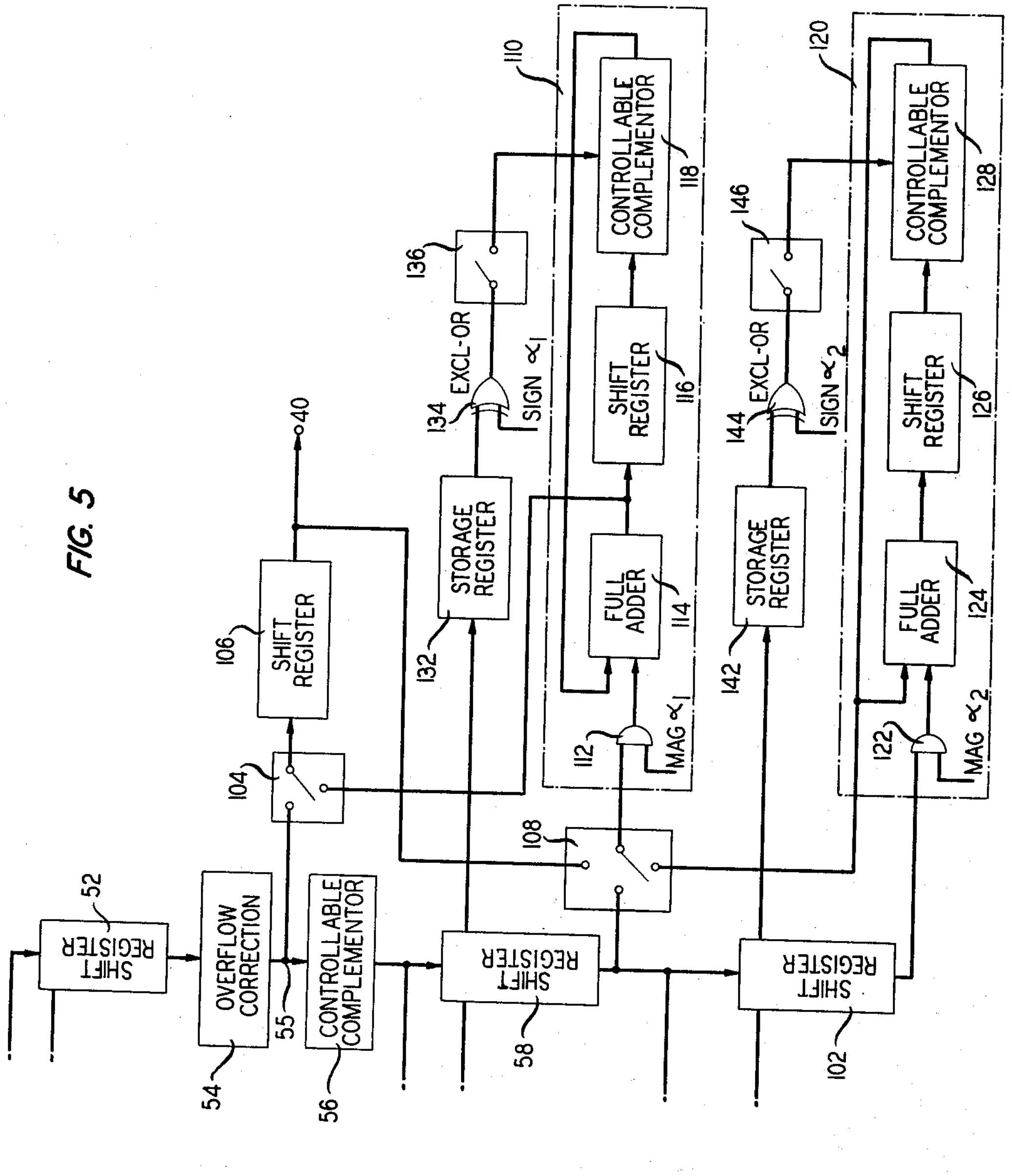
FIG. 5 is a block diagram of digital filter apparatus constructed in accordance with the principles of this invention which can be used in conjunction with the apparatus of FIG. 2 to perform the filtering operation performed by the filter of FIG. 4.

FIG. 5 shows how the general second-order filter of FIG. 4 may be constructed in accordance with the principles of this invention. Since the recursive portion of the filter is identical to that shown in FIG. 2, only so much of the apparatus of FIG. 2 as is necessary to an understanding of the feed-forward portion of the general second-order filter is shown again in FIG. 5. Thus serially connected devices 52, 54, 56, and 58 will be recognized as part of the apparatus (principally, the delay units) of the filter of FIG. 2. Shift registers 52 and 58 therefore correspond to delay units 14 and 16 in the filter of FIG. 4 while shift register 102 corresponds to delay unit 18 in that filter.

The arrangements of devices 112, 114, 116, and 118 and of devices 122, 124, 126, and 128 will be recognized as similar to either of the arithmetic units in the filter of FIG. 2. Accordingly, each of these arithmetic units is a serial sign-magnitude multiplier of the type discussed above which can also be used as a serial two's-complement adder. In particular, arithmetic unit 110 is used to multiply the output of shift register 58 by filter coefficient $\alpha_1$ and arithmetic unit 120 is used to multiply the output of shift register 102 by filter coefficient $\alpha_2$. At the same time, the two's-complement data word stored in register 52 is transferred to register 106 by way of switch 104. The two product words thus computed are then converted to two's-complement form and added in arithmetic unit 110. For this purpose, switch 108 is positioned to connect the output terminal of complementor 128 to one input terminal of enabled AND gate 112. Finally, this sum of products is added to the word stored in register 106 and the result returned to register 106. For this purpose, switch 108 is positioned to connect the output terminal of register 106 to one input terminal of enabled AND gate 112 while switch 104 is positioned to connect the output terminal of adder 114 to the input terminal of register 106. The resulting final output word is applied to output terminal 40 at the start of the next filter cycle when another word is transferred from register 52 to register 106. Since this coincides with the application of a new input word, input and output for the filter of FIG. 5 are compatible as desired.

Devices 132, 134, and 136 and devices 142, 144, and 146 are also similar to apparatus found in the filter of FIG. 2 (e.g., devices 82, 84, and 86). These devices therefore operate to determine the intended sign of the product word in each of registers 116 and 126 so that complementors 118 and 128 can be appropriately controlled to convert these product words from sign-magnitude to two's-complement form for addition as discussed above.

The feed-forward portion of the filter shown in FIG. 5 requires about the same number of devices as the feedback portion of the filter shown in FIG. 2, eliminating from the consideration of FIG. 5 those devices common with the filter of FIG. 2. Accordingly, the general second-order filter constructed in accordance with the principles of this invention can also be readily fabricated as a relatively small number of integrated circuits (e.g., two or four).

For some digital filtering applications only nonrecursive or feed-forward filters are required. In that case, it will be apparent that only as much of the general second-order filter as is shown in FIG. 5 is required in each second-order filter section. Indeed, since overflow protection is of less importance in nonrecursive filters, shift register 52 and overflow correction circuit 54 can be eliminated from the nonrecursive filter as shown in FIG. 5 and the data to be processed applied directly at point 55.

It is to be understood that the embodiments shown and described herein are illustrative of the principles of this invention only and that modifications may be implemented by those skilled in the art without departing from the spirit and scope of the invention. For example, either one's-complementation or two's-complementation can be employed as discussed above.

What is claimed is:

1. Digital filtering apparatus for processing successively applied digital input words by algebraically combining each input word with at least two recirculating data words, comprising:

first and second serially connected storage units;
first and second arithmetic units;
means for selectively applying the output of said first storage unit to said first arithmetic unit;
means for selectively applying the output of said second storage unit to said second arithmetic unit;
means for selectively applying the output of said second arithmetic unit to said first arithmetic unit;
means for selectively applying said input word to said first arithmetic unit including means for selectively applying said input word to said first storage unit; and
means for selectively applying the output of said first arithmetic unit to said first storage unit.

2. The apparatus defined in claim 1 further comprising:

a third storage unit serially connected to said second storage unit;
a fourth storage unit;
third and fourth arithmetic units;
means for selectively applying the output of said first storage unit to said fourth storage unit;
means for selectively applying the output of said second storage unit to said third arithmetic unit;
means for selectively applying the output of said third storage unit to said fourth arithmetic unit;
means for selectively applying to output of said fourth arithmetic unit to said third arithmetic unit;
means for selectively applying the output of said fourth storage unit to said fourth arithmetic unit; and
means for selectively applying the output of said fourth arithmetic unit to said fourth storage unit.

3. Digital filtering apparatus for processing successively applied digital input words by algebraically combining each input word with at least two preceding input words, comprising:

first and second serially connected storage units;
first and second arithmetic units;
means for selectively applying the output of said first storage unit to said first arithmetic unit;
means for selectively applying the output of said second storage unit to said second arithmetic unit;
means for selectively applying the output of said second arithmetic unit to said first arithmetic unit; and
means for selectively applying said input word to said first storage unit and to said first arithmetic unit.

4. In a digital filter for processing successively applied digital input words to produce successive digital output words by algebraically combining each input word with at least two previously computed output words, said filter including first and second serially connected delay units for successively delaying said previously computed output words and first and second multipliers for multipyling the output of said first and second delay units by first and second filter coefficients to produce first and second product words respectively, said first and second multipliers each including an accumulator for accumulating successive partial products, the improvement comprising:

means for applying said first and second product words to said accumulator of said first multiplier to produce a first sum word;
means for applying said first sum word and said input word to said accumulator of said first multiplier to produce an output word; and
means for applying said output word to said first delay unit.

5. The digital filter defined in claim 4 wherein said means for applying said first sum word and said input word to said accumulator of said first multiplier includes means for storing said input word in said first delay unit prior to its application to said accumulator.

6. In a digital filter for processing successively applied digital input words to produce successive digital output words by algebraically combining each input word with at least two previous input words, said filter including first and second serially connected delay units for successively delaying said previous input words and first and second multipliers for multiplying the output of said first and second delay units by first and second filter coefficients to produce first and second product words respectively, each of said first and second multipliers including an accumulator for accumulating successive partial products, the improvement comprising:

means for applying said first and second product words to the accumulator of one of said multipliers to produce a first sum word; and means for applying said input word and said first sum word to the accumulator of said one of said multipliers to produce an output word.

7. Digital filtering apparatus for processing successively applied digitally coded input words to produce successive digitally coded output words by algebraically combining each input word with weighted versions of a plurality of previously computed recirculating data words, comprising:

first and second serially connected delay devices for successively delaying said previously computed recirculating data words;

a first arithmetic unit for multiplying the data word produced by said first delay device by a first feedback filter coefficient to produce a first product word, said first arithmetic unit including an adder for accumulating successive partial product words;

a second arithmetic unit for multiplying the data word produced by said second delay device by a second feedback filter coefficient to produce a second product word;

means for applying said first and second product words to said adder of said first arithmetic unit for addition to produce a first sum word;

means for applying said first sum word and said input word to said adder for addition to produce a recirculating data word; and means for applying said recirculating data word to said first delay device.

8. The apparatus defined in claim 7 further comprising:

a third delay device serially connected to said second delay device for further delaying said previously computed recirculating data words;

a storage device for storing and reproducing an applied data word;

means for applying the data word produced by said first delay device to said storage device;

a third arithmetic unit for multiplying the data word produced by said second delay device by a first feedforward filter coefficient to produce a third product word, said third arithmetic unit including an adder for accumulating successive partial product words;

a fourth arithmetic unit for multiplying the data word produced by said third delay device by a second feedforward filter coefficient to produce a fourth product word;

means for applying said third and fourth product words to said adder of said third arithmetic unit for addition to produce a second sum word; and means for applying said second sum word and the data word produced by said storage device to said adder of said third arithmetic unit for addition to produce an output word.

9. Digital filtering apparatus for processing successively applied digitally coded input words to produce successive digitally coded output words by algebraically combining each input word with weighted versions of at least two previously applied input words comprising:

first and second serially connected delay devices for successively delaying said previously applied input words;

a first arithmetic unit for multiplying the data word produced by said first delay device by a first feedforward filter coefficient to produce a first product word, said first arithmetic unit including an adder for accumulating successive partial product words;

a second arithmetic unit for multiplying the data word produced by said second delay device by a second feed-forward filter coefficient to produce a second product word;

means for applying said first and second product words to said adder for addition to produce a first sum word; and means for applying said first sum word and said input word to said adder for addition to produce said output word.

10. Digital filtering apparatus for processing successively applied digitally coded input words to produce successive digitally coded output words by algebraically combining each input word with weighted versions of a plurality previously computed recirculating data words comprising:

first and second serially connected shift registers for successively delaying said previously computed recirculating data words;

a first serial multiplier for multiplying the data word produced by said first shift register by a first feedback filter coefficient to produce a first product word, said first multiplier including a first serial accumulator for accumulating successive partial product words;

a second serial multiplier for multiplying the data word produced by said second shift register by a second feedback filter coefficient to produce a second product word;

means for selectively applying said second product word to said first accumulator for serial addition to said first product word to produce a first sum word stored in said first accumulator;

means for selectively applying said input word to said first serial accumulator for serial addition to said first sum word to produce a recirculating data word; and means for selectively applying said recirculating data word to said first shift register.

11. The apparatus defined in claim 11 further comprising:

a third shift register serially connected to said second shift register for further delaying said previously computed recirculating data words;

a storage register for storing and reproducing an applied data word;

means for selectively applying the data word produced by said first shift register to said storage register;

a third serial multiplier for multiplying the data word produced by said second shift register by a first feed-forward filter coefficient to produce a third product word, said third multiplier including a second serial accumulator for accumulating successive partial product words;

a fourth serial multiplier for multiplying the data word produced by said third shift register by a second feed-forward filter coefficient to produce a fourth product word;

means for selectively applying said fourth product word to said second serial accumulator for serial addition to said third product word to produce a second sum word stored in said second accumulator; and means for selectively applying the data word produced by said storage register to said second serial accumulator for serial addition to said second sum word to produce an output word.

12. Digital filtering apparatus for processing successively applied digitally coded input words to produce successive digitally coded output words by algebraically combining each input word with weighted versions of at least two previously applied input words comprising:

first and second serially connected shift registers for successively delaying said previously applied input words;

a first serial multiplier for multiplying the data word produced by said first shift register by a first feed-forward filter coefficient to produce a first product word, said first multiplier including a serial accumulator for accumulating successive partial product words;

a second serial multiplier for multiplying the data word produced by said second shift register by a second feed-forward filter coefficient to produce a second product word;

means for selectively applying said second partial product word to said serial accumulator for serial addition to id first product word to produce a sum word stored in said accumulator and means for selectively applying said input word to said first shift register and to said serial accumulator for serial addition to said sum word to produce an output word.

* * * * *

UNITED STATES PATENT OFFICE
CERTIFICATE OF CORRECTION

Patent No. 3,714,402 Dated January 30, 1973

Inventor(s) Milton Baumwolspiner

It is certified that error appears in the above-identified patent and that said Letters Patent are hereby corrected as shown below:

In column 3, line 10, "G", first occurrence, should read --F--. Column 12, line 56, the parent reference numeral "11" of claim 11 should read --10--. Column 14, line 17, "id" should read --said--.

Signed and sealed this 10th day of July 1973.

(SEAL)
Attest:

EDWARD M.FLETCHER,JR.
Attesting Officer

Rene Tegtmeyer
Acting Commissioner of Patents